(12) United States Patent  
Suh

(10) Patent No.: US 7,288,888 B2  
(45) Date of Patent: Oct. 30, 2007

(54) ORGANIC ELECTROLUMINESCENT DISPLAY DEVICE INCLUDING A DUMMY PATTERN FOR PREVENTING SHORT CIRCUITING

(75) Inventor: Mi-Sook Suh, Yongin-si (KR)

(73) Assignee: Samsung SDI Co., Ltd, Suwon (KR)

( * ) Notice: Subject to any disclaimer, the term of this patent is extended or adjusted under 35 U.S.C. 154(b) by 263 days.

(21) Appl. No.: 10/976,275

(22) Filed: Oct. 29, 2004

(65) Prior Publication Data

US 2005/0093467 A1    May 5, 2005

(30) Foreign Application Priority Data

Nov. 5, 2003    (KR)    .............. 10-2003-0078120

(51) Int. Cl.  
*H01J 1/62* (2006.01)  
*H01J 63/04* (2006.01)

(52) U.S. Cl. .............. 313/506; 313/498; 313/504

(58) Field of Classification Search ............. 313/498, 313/500, 505, 506, 504  
See application file for complete search history.

(56) References Cited

U.S. PATENT DOCUMENTS 6,618,029 B1* 9/2003 Ozawa ............... 345/82

6,885,028 B2* 4/2005 Nishiki et al. ............. 257/59  
7,064,734 B2* 6/2006 Kawamura et al. ........ 345/80  
2003/0075718 A1* 4/2003 Jang et al. ................ 257/72  
2004/0012058 A1* 1/2004 Aoki ....................... 257/414

FOREIGN PATENT DOCUMENTS

| JP | 06-052990 | 2/1994 |
|----|-----------|--------|
| JP | 07-191349 | 7/1995 |
| JP | 11-024606 | 1/1999 |

* cited by examiner

*Primary Examiner*—Joseph Williams  
*Assistant Examiner*—Kevin Quarterman  
(74) *Attorney, Agent, or Firm*—H.C. Park & Associates, PLC

(57) ABSTRACT

An organic electroluminescent display device may have a dummy pattern that can induce a charge difference between interconnection lines and thus prevent a short circuit between the interconnection lines resulting from the charge difference. The organic electroluminescent display device may include a substrate and a plurality of metal lines arranged in a vertical direction and in a transverse direction on the substrate, as well as a dummy pattern formed between adjacent metal lines.

11 Claims, 5 Drawing Sheets

ORGANIC ELECTROLUMINESCENT DISPLAY DEVICE INCLUDING A DUMMY PATTERN FOR PREVENTING SHORT CIRCUITING

CROSS-REFERENCE TO RELATED APPLICATION

This application claims priority to and the benefit of Korean Patent Application No. 2003-78120, filed Nov. 5, 2003, the disclosure of which is incorporated herein by reference in its entirety.

BACKGROUND OF THE INVENTION

1. Field of the Invention

The present invention relates to an organic electroluminescent display device and, more particularly, to an organic electroluminescent display device that may have a dummy pattern that can induce a charge difference between interconnection lines. This can prevent a short circuit between the interconnection lines resulting from the charge difference in advance.

2. Description of the Related Art

FIG. 1 is a plan view illustrating a conventional organic electroluminescent display device.

In FIG. 1, reference numeral 100 denotes an organic electroluminescent display device, reference numeral 105 denotes a substrate, reference numeral 110 denotes an upper supply voltage line, reference numeral 120 denotes a lower supply voltage line, reference numeral 130 denotes a cathode voltage line, reference numeral 140 denotes a scan driver, reference numeral 150 denotes a data driver, and reference numeral 160 denotes a pixel region.

As shown in FIG. 1, the organic electroluminescent display device 100 includes the pixel region 160 that may display a certain image on a central portion, the upper supply voltage line 110 that may transfer a supply voltage to the pixel region 160 from a periphery of the pixel region 160, and the lower supply voltage line 120 that may transfer a supply voltage to the pixel region 160 from a lower portion of the pixel region. The scan driver 140 that outputs a selection signal may be arranged on one side of the pixel region 160. Similarly, the cathode supply voltage line 130 that outputs a cathode voltage to the pixel region may be arranged on the other side of the pixel region 160. The data driver 150 that outputs a data signal may be arranged below the lower supply voltage line 120.

If a control signal is applied through an input stage of each interconnection line, the scan driver 140 and the data driver 150 may respectively apply a selection signal and a data signal to the pixel region 160. Consequently, thin film transistors (TFTs) of unit pixels arranged on the pixel region 160 may be turned on.

A supply voltage and a cathode voltage may be respectively applied to the pixel region 160, from the upper supply voltage line 110 and the cathode voltage line 130. As a result, the unit pixels arranged on the pixel region 160 may display various colors. Thus, a certain image may be displayed on the pixel region 160.

As described above, the organic electroluminescent display device 100 may be driven by supply voltages and control signals that may be transmitted through a plurality of power lines and signal lines arranged on a substrate. The power lines and signal lines may be made of a gate metal and a source-drain metal, as illustrated in FIGS. 2 and 3. FIGS. 2 and 3 show a layout of the scan driver.

FIG. 2 is a plan view illustrating a conventional configuration of interconnection lines.

In FIG. 2, reference numeral 105 denotes a substrate, reference numeral 141 denotes a gate metal line, and reference numeral 142 denotes a source-drain metal line.

As shown in FIG. 2, the scan driver 140 may include a plurality of gate metal lines 141 and source-drain metal lines 142. The gate metal line 141 may connect to another metal line through a contact hole, may extend and pass below the source-drain metal line 142, or may connect to the source-drain metal line 142 through the contact hole (see 147 in FIG. 3). That is, the gate metal line 141 and the source-drain metal line 142 may be connected like the portion A of FIG. 2, which will be described below with reference to FIG. 3.

FIG. 3 is an enlarged plan view illustrating portion A of FIG. 2.

As described above, the gate metal line 141 may pass below the source-drain metal line 142 in a transverse direction or may connect to the source-metal line 142 through a contact hole 147. For ease of explanation, the gate metal lines and the source metal lines may be referred to as simply first to fourth metal lines.

In FIG. 3, reference numeral 105 denotes a substrate and reference numerals 143 to 146 denote first to fourth metal lines, respectively.

As shown in FIG. 3, the first and second metal lines 143 and 144 may be arranged in parallel in a vertical direction, the third metal line 145 may be arranged in a transverse direction to connect to the first metal line 143 through the contact hole 147, and the fourth metal line 146 may be arranged in a transverse direction to pass below the first metal line and to connect to the second metal line 144 through the contact hole 147.

In an organic electroluminescent display device having the wiring configuration described above, not only the signal lines of the scan driver 140 but also those of the data driver 150 may have the same wiring configuration as shown in FIG. 3. The supply voltage and cathode voltage lines may also have the same wiring configuration as shown in FIG. 3.

However, a charge difference may occur between the adjacent lines described above because charges may accumulate on the periphery of the pattern. Indeed, charges may be focused on the periphery of the third metal line 145 pattern that is connected to the first metal line 143 through the contact hole 147. Thus, the charges may not be balanced with charges of the fourth metal line 146 that is not connected to and passes below the first metal line 143. This may lead to a charge difference. Thus, dielectric breakdown (resulting in charge damage) may occur at a portion adjacent to the periphery of the third metal line 145 pattern (e.g., a portion B). As a result, the first metal line 143 may incorrectly connect to the fourth metal line 146, leading to a short circuit.

SUMMARY OF THE INVENTION

The present invention, therefore, may help to solve the aforementioned problems associated with conventional devices by providing an organic electroluminescent display device in which a dummy pattern can be arranged at a location adjacent to the periphery of an interconnection line pattern on which charges are focused. This may induce charge damage resulting from a charge difference with a metal line adjacent to the dummy pattern, thereby preventing an undesired short circuit.

In an exemplary embodiment of the present invention, an organic electroluminescent display device having a substrate and a plurality of metal lines arranged in a vertical direction and in a transverse direction on the substrate may include a dummy pattern formed between adjacent metal lines.

The plurality of metal lines include a first metal line arranged in one direction, a second metal line having an end portion connected to the fist metal line, and a third metal line arranged in parallel with the second metal line and passing the first metal line, and the dummy pattern may be formed in the first metal line to be closer to the second metal line than the third metal line.

The dummy pattern may be formed at a location adjacent to one side of the end portion of the second metal line that is connected to the first metal line.

The dummy pattern may be formed at a location adjacent to the other side of the end portion of the second metal line that is connected to the first metal line.

Another exemplary embodiment of the present invention may be an organic electroluminescent display device having a substrate and a plurality of metal lines arranged in a vertical direction and in a transverse direction on the substrate. It may also include a first metal line arranged in one direction, a second metal line arranged in parallel with the first metal line, a third metal line having an end portion connected to the first metal line arranged in a perpendicular direction thereto, and a fourth metal line having an end portion connected to the second metal line arranged in parallel with the third metal line and passing the first metal line, wherein dummy patterns may be formed in the first and second metal lines, respectively.

The dummy pattern may be formed in the first metal line to be closer to the third metal line than the fourth metal line. The dummy pattern may be formed at a location adjacent to one side of the end portion of the third metal line that is connected to the first metal line. The dummy pattern may be formed at a location adjacent to the other side of the end portion of the third metal line that is connected to the first metal line. The dummy pattern may be formed at a location adjacent to the end portion of the fourth metal line that is connected to the second metal line.

Yet another exemplary embodiment of the present invention may be an organic electroluminescent display device having a substrate and a plurality of metal lines arranged in a vertical direction and in a transverse direction on the substrate. This embodiment may also include a plurality of source-drain metal lines arranged in parallel in one direction, a plurality of gate metal lines connected to the source and drain metal lines, and a dummy pattern formed in the source and drain metal line connected to the gate metal line.

The dummy pattern may be formed in the source and drain metal line at a location adjacent to the periphery of the pattern of the gate metal line accumulates a large amount of charge.

DETAILED DESCRIPTION OF THE INVENTION

Figure 1:
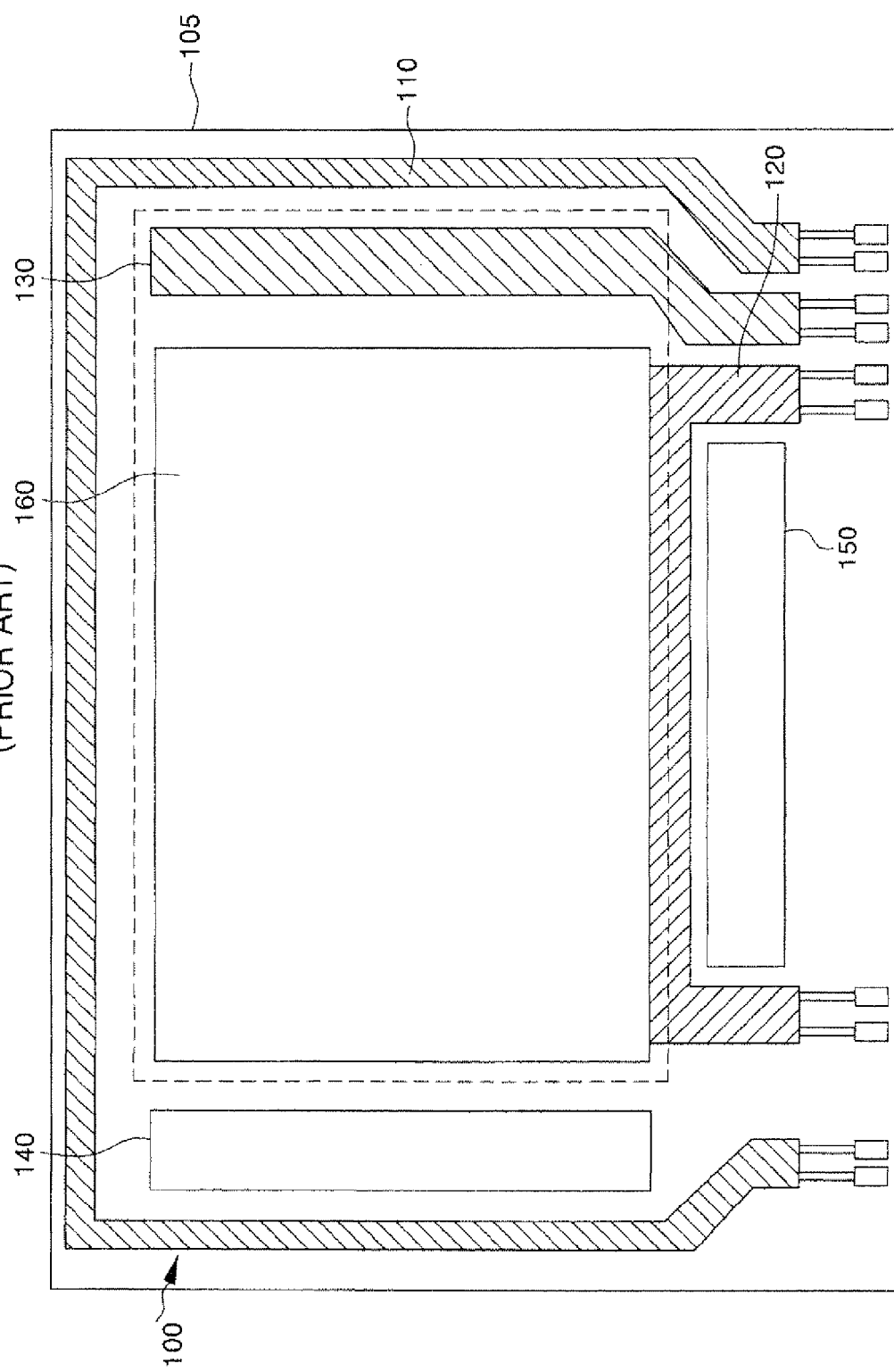
FIG. 1 is a plan view illustrating a conventional organic electroluminescent display device.
Figure 2:
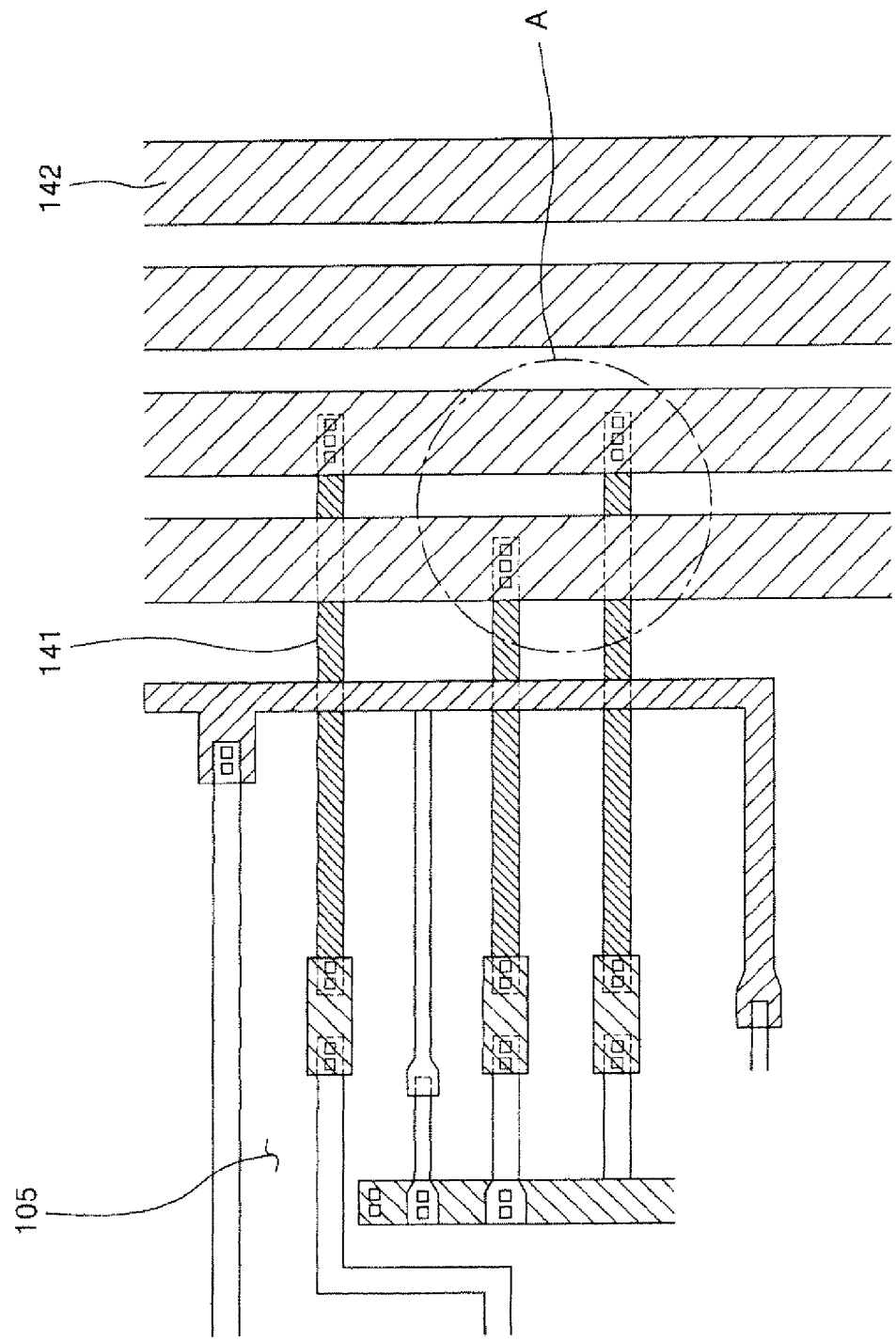
FIG. 2 is a plan view illustrating a conventional configuration of interconnection lines.
Figure 3:
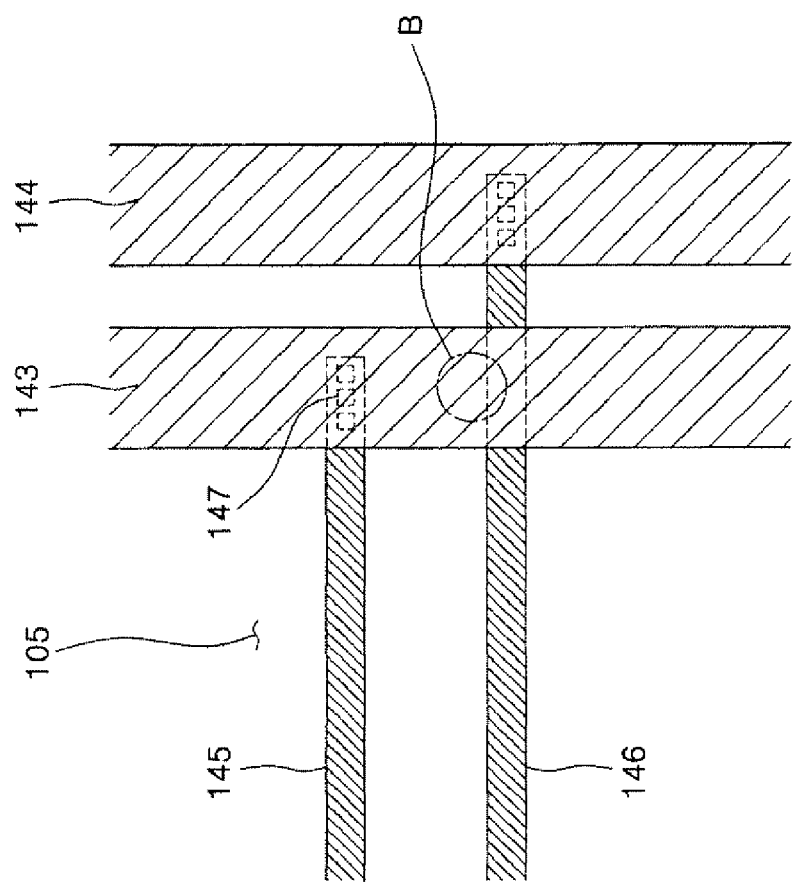
FIG. 3 is an enlarged plan view illustrating the portion A of FIG. 2.

The present invention will now be described more fully hereinafter with reference to the accompanying drawings, in which preferred embodiments of the invention are shown. This invention, however, may be embodied in different forms and should not be construed as limited to the embodiments set forth herein. In the drawings, the thickness of layers and regions have been exaggerated for clarity. Like numbers refer to like elements throughout the specification.

Figure 4:
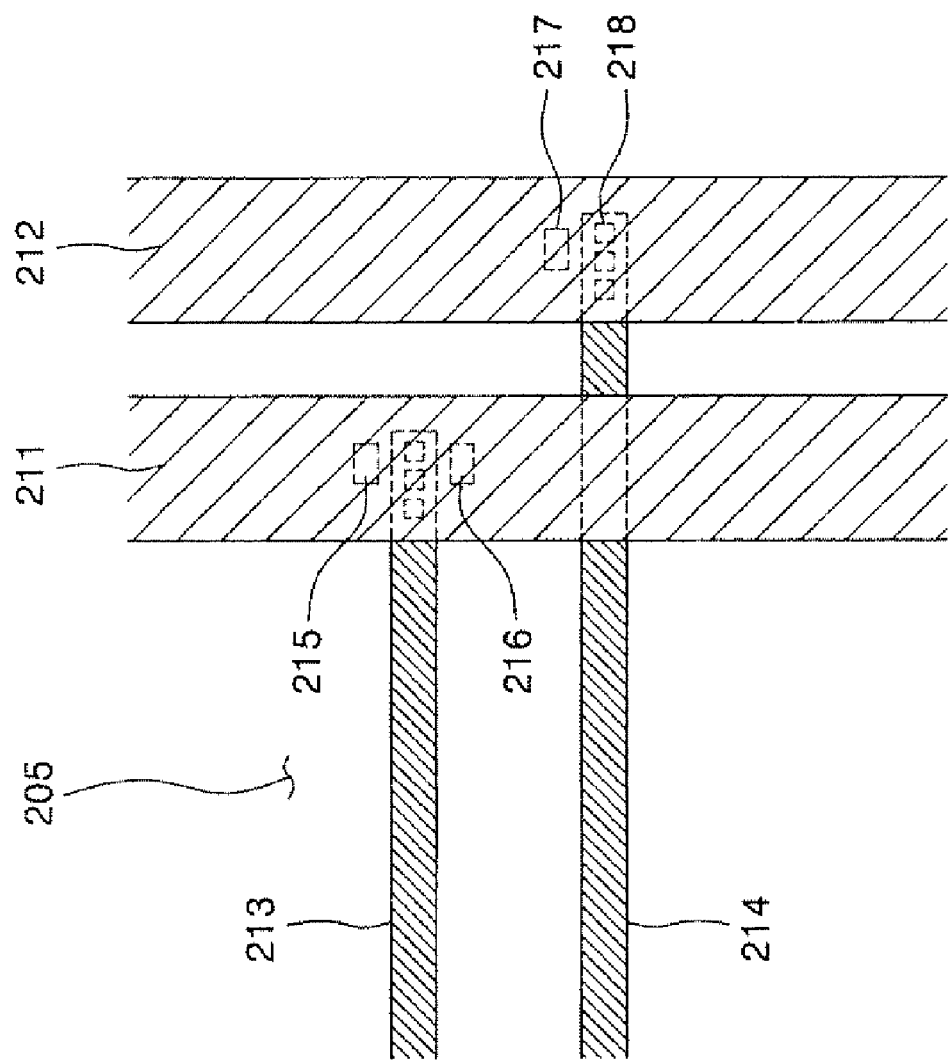
FIG. 4 is a plan view illustrating a configuration of interconnection lines of an organic electroluminescent display device according to an exemplary embodiment of the present invention.

FIG. 4 is a plan view illustrating a configuration of interconnection lines of an organic electroluminescent display device according to an exemplary embodiment of the present invention.

In FIG. 4, reference numeral 205 denotes a substrate and reference numerals 211 to 214 denote first to fourth metal lines, and reference numerals 215 to 217 denote first to third dummy patterns, and reference numeral 218 denotes a contact hole.

As shown in FIG. 4, the first and second metal lines 211 and 212 may be parallel in a vertical direction, and the third metal line 213 may be arranged in a transverse direction to connect to the first metal line 211. The fourth metal line 214 may be arranged in parallel with the third metal line 213 to pass below the first metal line 211 and to connect to the second metal line 212. Here, the third and fourth metal lines 213 and 214 may respectively connect to the first and second metal lines 211 and 212 through contact holes 218.

Also, first and second dummy patterns 215 and 216 may be arranged at locations of the first metal line 211 adjacent to both sides of a connection portion between the first and third metal lines 211 and 213.

In addition, a third dummy pattern 217 may be arranged at a location adjacent to one side of a connection portion between the second and fourth metal lines 212 and 214.

As described above, the first and second dummy patterns 215 and 216 may be arranged at the first metal line 211 to be located between the third and fourth metal lines 213 and 214. Thus, this may induce a charge difference between the third metal line 213 and the second dummy pattern 216 instead of a charge difference between the third and fourth metal lines 213 and 214.

In more detail, charge accumulation may typically be focused on the periphery of a connection portion between the first and third metal lines 211 and 213, leading to a charge difference with the fourth metal line 214. However, the second dummy pattern 216 may be formed at a location closer to the third metal line 213 than the fourth metal line 214, and thus a charge difference occurs between the third metal line 213 and the second dummy pattern 216 rather than between the third and fourth metal lines 213 and 214. As a result, the third metal line 213 or the second dummy pattern 216 may undergo dielectric breakdown due to charge damage resulting from the charge difference, leading to a short circuit with the first metal line 211.

However, the first metal line 211 is already connected to the third metal line 213. Thus a short circuit between the first and third metal lines 211 and 213 may not be considered a failure. Thus a real failure resulting from a charge difference with the fourth metal line 214 may be prevented.

The fourth metal line 214 may connect to the second metal line 212 through the contact hole 218, and the third dummy pattern 217 may be formed at a location adjacent to the connection portion.

Here, the third dummy pattern 217 may be formed to prevent a failure resulting from a charge difference with another metal line (not shown) that is not connected to the second metal line 212 and is adjacent to and passes the fourth metal line 214. That is, the third dummy pattern 217 may be formed at a location adjacent to one side of the fourth metal line 214 pattern to induce a charge difference with the fourth metal line 214 by charges that are focused on the periphery of the fourth metal line 214 pattern. This may prevent charge damage of another metal line adjacent to the fourth metal line 214. Here, the short circuit of the fourth metal line 214 resulting from the charge difference between the fourth metal line 214 and the third dummy pattern 217 may not be considered a failure because the fourth metal line 214 and the second metal line 212 may be intended to be connected or may already be connected.

Figure 5:
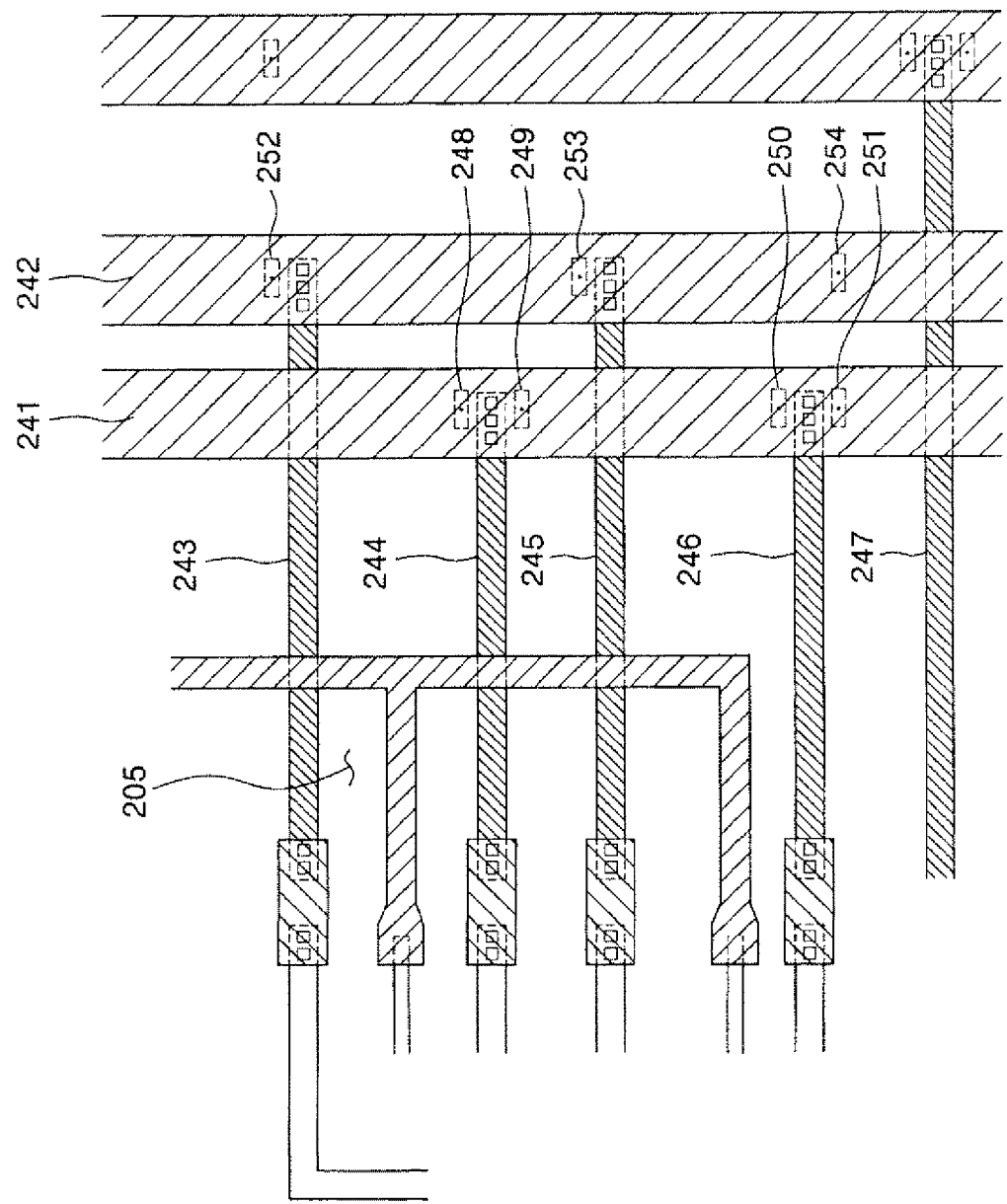
FIG. 5 is a plan view illustrating a configuration of interconnection lines of a scan driver according to an exemplary embodiment of the present invention.

FIG. 5 is a plan view illustrating a configuration of interconnection lines of a scan driver.

In FIG. 5, reference numeral 205 denotes a substrate and reference numerals 241 to 247 denote first to seventh metal lines, and reference numerals 248 to 254 denote first to seventh dummy patterns, respectively. The first and second metal lines 241 and 242 may denote a source-drain metal, and the third to seventh metal lines 243 to 247 may be gate metals. For ease of description, the source-drain metal lines and the gate metal lines may be respectively referred to as the first and second metal lines 241 and 242 and the third metal lines to seventh metal lines 243 to 247.

The first and second metal lines 241 and 242 may be arranged in parallel in a vertical direction, and the third to seventh metal lines 243 to 247 may be arranged in a transverse direction to pass below or be connected to the first and second metal lines 241 and 242.

That is, the third metal line 243 passes below the first metal line 241 to connect to the second metal line 242 through a contact hole. The fifth dummy pattern 252 may be formed at a location adjacent to one side of a connection portion between the third metal line 243 and the second metal line 242. The fourth metal line 244 may connect to the first metal line 241, and the first and second dummy patterns 248 and 249 may be formed at locations adjacent to both sides of a connection portion between the fourth metal line 244 and the first metal line 241.

The fifth metal line 245 may pass below the first metal line 241 to connect to the second metal line 242 through a contact hole. The sixth dummy pattern 253 may be formed at a location adjacent to one side of a connection portion between the fifth metal line 245 and the second metal line 242. The sixth metal line 246 may connect to the first metal line 241, and the third and fourth dummy patterns 250 and 251 may be formed at locations adjacent to both sides of a connection portion between the sixth metal line 246 and the first metal line 241. The seventh metal line 247 may pass below the first and second metal lines 241 and 242 to connect to another metal line through a contact hole.

Here, the first dummy pattern 248 may induce a charge difference with the fourth metal line 244 to prevent charge damage resulting from a charge difference between the third metal line 243 and the fourth metal line 244. The second dummy pattern 249 may induce a charge difference with the fourth metal line 244 to prevent charge damage between the fourth metal line 244 and the fifth metal line 245. The third dummy pattern 250 may induce a charge difference with the sixth metal line 246 to prevent a short circuit between the first metal line 241 and the fifth metal line 245 resulting from a charge difference between the fifth metal line 245 and the sixth metal line 246. The fourth dummy pattern 251 may induce a charge difference with the sixth metal line 246 to prevent a short circuit between the first metal line 241 and the seventh metal line 247 resulting from a charge difference between the sixth metal line 246 and the seventh metal line 247.

Here, a dielectric breakdown (charge damage) may occur between the fourth metal line 244 and the sixth metal line 246 due to the charge difference inducement of the first to fourth dummy patterns 248 to 251. However, the fourth metal line 244 and the sixth metal line 246 may be intended to connect to the first metal line 241, and thus this may not be considered a real failure.

The fifth dummy pattern 252 may be formed at a location adjacent to one side of a connection portion between the third and second metal lines 243 and 242 to prevent charge damage between the third metal line 243 and another metal line (not shown).

The sixth dummy pattern 253 may be formed at a location adjacent to one side of a connection portion between the fifth and, second metal lines 245 and 242 to induce charge damage with the fifth metal line 245. Here, the sixth dummy pattern 253 prevents not only charge damage with another metal line as described above but also charge damage in the same interconnection line.

Typically, a charge distribution variation may occur even in the same interconnection line because the amount of accumulated charges may differ by location. In particular, charges may be focused on an edge or a connection portion at which a plurality of interconnection lines are connected to each other. Therefore, charge damage may occur due to the unbalance of charges. For example, an interconnection line can be cut, or each layer that constitutes a cross section of an interconnection line can be broken. Therefore, the sixth dummy pattern 253 may induce a charge difference with the fifth metal line 245 and so may make charge damage resulting from charges of the fifth metal line 245 occur on the sixth dummy pattern 253.

The seventh dummy pattern 254 may induce a charge difference with the fifth metal line 245 to prevent a charge difference between the fifth metal line 245 and the seventh metal line 247, thereby preventing charge damage between the second metal line 242 and the seventh metal line 247.

As described above, the organic electroluminescent display device may have a dummy pattern between a gate metal line that may connect to a source-drain metal line and a gate metal line that passes below the source-drain metal line to induce a charge difference. This may prevent a failure resulting from a short circuit between the gate metal line and the source-drain metal line.

Although the present invention has been described with reference to certain exemplary embodiments thereof, it will be understood that a variety of changes may be made to the described embodiments, while still practicing the invention.

What is claimed is:

1. An organic electroluminescent display device, comprising:
    a plurality of metal lines arranged in a vertical direction and in a transverse direction on a substrate; the plurality of metal lines comprising:
    a first metal line in a first direction;
    a second metal line comprising an end portion connected to the first metal line;

a third metal line arranged in parallel with the second metal line and passing the first metal line; and a dummy pattern formed between the second metal line and the third metal line.

2. The device of claim 1, wherein the dummy pattern is formed in the first metal line to be closer to the second metal line than the third metal line.

3. The device of claim 2, wherein the dummy pattern is formed at a location adjacent to one side of the end portion of the second metal line that is connected to the first metal line.

4. The device of claim 2, wherein the dummy pattern is formed at a location adjacent to the other side of the end portion of the second metal line that is not connected to the first metal line.

5. An organic electroluminescent display device comprising:

a substrate; and a plurality of metal lines arranged in a vertical direction and in a transverse direction on the substrate, the plurality of metal lines comprising:

a first metal line arranged in one direction;

a second metal line arranged in parallel with the first metal line;

a third metal line having an end portion connected to the first metal line and being arranged in a perpendicular direction thereto; and a fourth metal line having an end portion connected to the second metal line and being arranged in parallel with the third metal line and passing the first metal line, wherein dummy patterns are formed in the first and second metal lines, respectively.

6. The device of claim 5, wherein the dummy pattern is formed in the first metal line to be closer to the third metal line than the fourth metal line.

7. The device of claim 6, wherein the dummy pattern is formed at a location adjacent to one side of the end portion of the third metal line that is connected to the first metal line.

8. The device of claim 6, wherein the dummy pattern is formed at a location adjacent to the other side of the end portion of the third metal line that is connected to the first metal line.

9. The device of claim 5, wherein the dummy pattern is formed at a location adjacent to the end portion of the fourth metal line that is connected to the second metal line.

10. An organic electroluminescent display comprising:

a substrate; and a plurality of metal lines arranged in a vertical direction and in a transverse direction on the substrate, the plurality of metal lines comprising:

a plurality of source and drain metal lines arranged in parallel in one direction;

a plurality of gate metal lines comprising an end portion connected to the plurality of source and drain metal lines; and a dummy pattern arranged in at least one of the source and drain metal lines that connect to the gate metal lines.

11. The device of claim 10, wherein the dummy pattern is formed in at least one of the source and drain metal lines at a location adjacent to a periphery of the gate metal line pattern that accumulates a charge.

* * * * *